US009538303B2

(12) United States Patent
Gautama (10) Patent No.: US 9,538,303 B2
(45) Date of Patent: Jan. 3, 2017

(54) SYSTEM AND METHOD FOR ADAPTING A LOUDSPEAKER SIGNAL (71) Applicant: NXP B.V., Eindhoven (NL)

(72) Inventor: Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 40 days.

(21) Appl. No.: 14/634,402

(22) Filed: Feb. 27, 2015

(65) Prior Publication Data

US 2015/0230037 A1 Aug. 13, 2015

Related U.S. Application Data (63) Continuation of application No. 13/021,486, filed on Feb. 4, 2011, now Pat. No. 9,014,384.

(30) Foreign Application Priority Data

Feb. 10, 2010 (EP) .................................... 10153210

(51) Int. Cl.
*H04R 29/00* (2006.01)
*H03F 1/30* (2006.01)
(Continued)

(52) U.S. Cl.
CPC ............. *H04R 29/001* (2013.01); *H03F 1/30* (2013.01); *H03F 1/52* (2013.01); *H03F 3/187* (2013.01);
(Continued)

(58) Field of Classification Search
CPC ..... H04R 29/00; H04R 29/001; H04R 29/003; H04R 3/007; H03F 1/30; H03F 1/52; H03F 3/187; H03F 2200/468; H03F 2200/447
(Continued)

(56) References Cited

U.S. PATENT DOCUMENTS 5,506,910 A 4/1996 Miller et al.
6,386,039 B1 * 5/2002 Peters .................... G01N 29/14
702/39

(Continued)

FOREIGN PATENT DOCUMENTS

CN 1951148 A 4/2007
CN 102113346 A 6/2011
(Continued)

OTHER PUBLICATIONS

Behler, G. et al. "Measuring the Loudspeaker's Impedance during Operation for the Derivation of the Voice Coil Temperature", 998th Convention of the Audio Engineering Society, 1-21 pgs. (Feb. 22, 2000).

(Continued)

*Primary Examiner* — Vivian Chin
*Assistant Examiner* — William A Jerez Lora (57) ABSTRACT An audio controller for use with a loudspeaker that generates sound in dependence upon a loudspeaker signal is disclosed. The loudspeaker includes a voice coil. The audio controller includes a monitor to monitor an electric response of the voice coil to the loudspeaker signal and a signal generator to generate an evaluation signal. The evaluation signal comprises a signal having an evaluation frequency that is below resonant frequency of the loudspeaker. A processing unit is included to generate, based on the monitored electric response, the loudspeaker signal from an input sound signal. The processing unit is configured to combine the evaluation signal with the input sound signal to generate the loudspeaker signal.

18 Claims, 5 Drawing Sheets (51) Int. Cl.
*H03F 1/52* (2006.01)
*H03F 3/187* (2006.01)
*H04R 3/00* (2006.01)
*H04R 1/00* (2006.01)

(52) U.S. Cl.
CPC ............... *H04R 1/00* (2013.01); *H04R 3/007* (2013.01); *H04R 29/003* (2013.01); *H03F 2200/447* (2013.01); *H03F 2200/468* (2013.01)

(58) Field of Classification Search
USPC .... 381/1, 55, 57, 59, 71.11, 92, 98, 99, 103, 381/104, 121, 165, 191
See application file for complete search history.

(56) References Cited

U.S. PATENT DOCUMENTS

| | | | | |
|---|---|---|---|---|
| 6,865,274 | B1* | 3/2005 | Aarts | H04R 3/007 |
| | | | | 381/55 |
| 6,940,981 | B2* | 9/2005 | Neunaber | H03F 1/52 |
| | | | | 330/254 |
| 7,372,966 | B2 | 5/2008 | Bright | |
| 2004/0178852 | A1 | 9/2004 | Neunaber | |
| 2005/0027584 | A1 | 2/2005 | Fusari | |
| 2006/0002571 | A1 | 1/2006 | Holloway et al. | |
| 2008/0219458 | A1* | 9/2008 | Brooks | H03G 3/32 |
| | | | | 381/57 |
| 2010/0135118 | A1 | 6/2010 | Van Leest et al. | |
| 2010/0292993 | A1* | 11/2010 | Vaillancourt | G10L 19/032 |
| | | | | 704/500 |
| 2010/0310086 | A1* | 12/2010 | Magrath | G10K 11/178 |
| | | | | 381/71.11 |

FOREIGN PATENT DOCUMENTS

| | | |
|---|---|---|
| EP | 22296006 A1 | 9/2010 |
| WO | 2009087772 A1 | 7/2009 |
| WO | 2010/014663 A2 | 2/2010 |
| WO | 2010014663 A2 | 2/2010 |

OTHER PUBLICATIONS

Extended European Search Report for Patent Appln. No. 16165148.4 (Sep. 1, 2016).
Behler G, et al. "Measuring the Loudspeaker's Impedance During Operation for the Evaluation of the Voice Coil Temperature," 98$^{th}$ Convention of the Audio Engineering Society, Paris, France, 12 pgs. (May 1995).
Buck, M. "Measuring Loudspeaker Voicecoil Temperature," 106$^{th}$ Convention of the Audio Engineering Society, Munich, Germany, 6 pgs. (May 1999).
Chapman, P. "Complete Thermal Protection of an Active Loudspeaker," 108$^{th}$ Convention of the Audio Engineering Society, Paris, France, 21 pgs., (Feb. 2000).
Klippel, W. "Nonlinear Modeling of the Heat Transfer in Loudspeakers," J. Audio Eng. Soc. 52, 43 pgs. (2004).
Bortoni, C., et al. "Real-Time Voice-Coil Temperature Control and Cone Displacement Control of Loudspeakers," 117$^{th}$ Convention of the Audio Engineering Society, San Francisco, CA, 8 pgs. (Oct. 2004).
Chapman, P., "Thermal Simulation of Loudspeakers," Proc. of the 104th AES Convention, Amsterdam, Paper No. 4667 (May 2008).
Extended European Search Report for European Patent Appln. No. 10153210.9 (Jul. 13, 2010).
CN Application No. 201110035782.9 Chinese Patent Review Board Invalidation Decision mailed Jun. 1, 2016, 24 pgs. (w English Translation).
Bortoni, C., et al. "Real-Time Voice-Coil Temperature Control and Cone Displacement Control of Loudspeakers," 117th Convention of the Audio Engineering Society, San Francisco, CA, 8 pgs. (Oct. 2004) (already cited Feb. 27, 2015).
Klippel. W. "The Mirror Filter—A New Basis for Reducing Nonlinear Distortion and Equalizing Response in Woofer Systems", J. Audio Eng. Soc., vol. 40, No. 9, pp. 675-691(Sep. 1992).

* cited by examiner

SYSTEM AND METHOD FOR ADAPTING A LOUDSPEAKER SIGNAL

CROSS REFERENCE TO RELATED APPLICATIONS

This application is a continuation of copending U.S. patent application Ser. No. 13/021,486 filed on Feb. 4, 2011, which claims priority under 35 USC 119 to European Patent Application No. 10153210.9 filed on Feb. 10, 2010, the contents of which are incorporated by reference herein.

FIELD OF THE INVENTION

The invention relates to a sound system for producing sound, the sound system comprising a processing unit for processing an input sound signal to produce a loudspeaker signal, a loudspeaker for generating sound in dependency on the loudspeaker signal, the loudspeaker comprising a voice coil for driving the loudspeaker, a temperature of the voice coil depending on the loudspeaker signal, and a monitor for monitoring an electric response of the voice coil to the loudspeaker signal, the processing unit being configured for adapting the loudspeaker signal to control the temperature of the voice coil in dependency on the monitored response.

The invention further relates to a method for producing sound, a method for obtaining a temperature of a voice coil, and corresponding computer programs.

BACKGROUND

Loudspeakers are devices to convert electrical energy into acoustical energy. However, much of the electrical power that is applied to the loudspeaker results in heat dissipation, which causes many of the common loudspeaker defects. To prevent thermal damage (permanent or transitory), it is desirable to measure the voice coil temperature of the loudspeaker, and to condition the input in such a way that this temperature does not exceed a certain limit.

One way to estimate the voice coil temperature is to predict its value from the electrical signal that is sent to the loudspeaker using a mathematical model of the loudspeaker using a number of pre-estimated parameters, see e.g., Klippel, W., 2004. "*Nonlinear Modeling of the Heat Transfer in Loudspeakers*". J. Audio Eng. Soc. 52, 3-25.

A different approach is to measure the current and voltage in the voice coil directly and estimate its temperature based on those measurements. This approach is taken in Behler, Gottfried; Spätling, U.; Arimont, T., February 1995, "Measuring the Loudspeakers Impedance During Operation for the Evaluation of the Voice Coil Temperature", in: Proceedings of the 98th AES Convention, Paris. Paper number 4001. This document will be referred to as Behler 1995.

From the measured voltage and current the DC resistance of the loudspeaker, also referred to as Re, is determined. The DC resistance is estimated as the average of the real part of the impedance for frequencies in the vicinity of the minimum impedance exceeding the resonant frequency of the loudspeaker. Since the DC resistance depends on the temperature of the voice coil, one may determine the temperature from the DC resistance.

Also U.S. Pat. No. 6,940,981, with title "Apparatus and method of limiting power applied to a loudspeaker" takes this approach. The patent discloses a method of limiting the power applied to a loudspeaker. In the method both the voltage and current applied to the loudspeaker are measured and instantaneous power is directly calculated and used to control the level of the input signal that drives the amplifier powering the loudspeaker. When the power applied to the loudspeaker exceeds a prescribed threshold, the input level to the power amplifier is reduced until the measured power falls below the threshold. Also disclosed is a method for indirectly determining the voice coil temperature from the loudspeakers voltage and current and reducing power to the loudspeaker when the temperature exceeds a prescribed threshold. This document will be referred to as Neunaber, 2005.

SUMMARY

The methods to estimate voice coil temperature noted above all have their drawbacks.

Prediction methods, such as the one by Klippel require model parameters that need to be estimated on-line. This requires a calibration phase, which is either unattractive from a user-point-of-view, or needs to be added as part of the production process. Furthermore, model parameters may not remain fixed throughout the life-span of the loudspeaker, and may at some point require re-calibration. A further disadvantage of modeling is that environmental factors, such as heat dissipation due to the temperature of the surrounding environment, are hard to take into account. The temperature of the voice coil depends not only on the loudspeaker signal but also on the temperature of the environment.

Methods based on measuring current and voltage in the voice coil require that there is sufficient signal energy in the loudspeaker input signal. If the input signal lacks sufficient energy around the frequencies which are used for the calculations involved with making the estimate then the method fails and is unable to estimate the temperature of the voice coil. This problem occurs if the input signal is low overall, e.g., a passage of silence or of little sound, but may also happen for other signals. For example, to estimate the DC resistance, frequencies in the vicinity of the minimum impedance exceeding the resonant frequency of the loudspeaker must be sufficiently available in the input signal. The latter condition may not be met for input signals resembling pure sine waves.

Especially small loudspeakers are sensitive to defects caused by overheating of the voice coil, since these loudspeakers are likely to be used at or close to their maximum volume. Small loudspeakers are used for example in portable audio and/or video devices, mobile phones, loudspeakers for use with a computer (either built into a computer, e.g., a laptop or connectable to a computer, e.g., to a desktop computer), portable loudspeakers for connection to an audio device, loudspeakers for use in a car, television, radio, etc.

It would therefore be of advantage to have method or system for adapting a loudspeaker signal to control the temperature of its voice coil which allows continuous monitoring of the temperature of the voice coil, without the need to fully model the loudspeaker.

A sound system for producing sound is provided. The sound system comprises a processing unit for processing an input sound signal to produce a loudspeaker signal, a loudspeaker for generating sound in dependency on the loudspeaker signal, the loudspeaker comprising a voice coil for driving the loudspeaker, a temperature of the voice coil depending on the loudspeaker signal, and a monitor for monitoring an electric response of the voice coil to the loudspeaker signal, the processing unit being configured for adapting the loudspeaker signal to control the temperature of the voice coil in dependency on the monitored response. The processing unit comprises a signal generator for generating an evaluation signal, processing the input sound signal to produce a loudspeaker signal comprises combining the evaluation signal with the input sound signal.

Generating an evaluation signal and combining it with the input sound signal ensures that the loudspeaker signal comprises a signal suitable for evaluation, i.e., a signal which has sufficient energy in the frequencies which are monitored and used for adapting the loudspeaker signal. Monitoring the electric response of the voice coil to the loudspeaker signal includes monitoring the response of the voice coil to the evaluation signal. Adapting the loudspeaker signal to control the temperature of the voice coil is in particular in dependency on the monitored response to the evaluation signal. In this way a continuous monitoring of the temperature of the voice coil is possible, allowing a better and timelier response. For example, during a period in which the input sound signal comprises insufficient energy for methods of the prior art to determine the temperature of the voice coil, the voice coil may cool down. A cooled down voice coil allows, e.g., the sound pressure to increase somewhat, or to reduce other measures that may have been taken to reduce voice coil temperature, thus increasing its volume and/or its quality of the sound output.

In an embodiment, the monitor is configured for monitoring electric current in the voice coil and, optionally, electric voltage over the voice coil.

The electric current that flows through the voice coil depends on the temperature of the voice coil. Measuring the current allows the temperature to be measured. The voltage across the voice coil also depends on the temperature of the voice coil, although to a lesser extent. For increased accuracy, the voltage is also monitored. If the voltage is not monitored, the voltage may be approximated by a processed value of the adapted input sound signal. For example, the voltage may be approximated by a linearly scaled version of the loudspeaker signal before amplification.

In an embodiment, the monitored current and/or voltage are transformed into the frequency domain, from which the DC resistance can be obtained, or the impedance at a particular frequency. Both these quantities depend on the temperature of the voice coil, such that if the temperature increases the DC resistance and magnitude of the impedance at a particular frequency also increases.

In an embodiment, an impedance of the loudspeaker and/or temperature of the voice coil is determined from the monitored response. Adapting the loudspeaker signal to control the temperature of the voice coil is dependent on the determined impedance of the loudspeaker and/or temperature of the voice coil.

An embodiment may reduce temperature induced artifacts in the voice coil, as follows. The current and/or voltage is monitored. From these measurements the impedance at a particular frequency is determined. From the impedance the temperature of the voice coil is determined, for example using a table listing the relation between the impedance at a frequency and temperature. Instead of a table, one may solve a formula which gives a relation between the temperature of the voice coil and a quantity depending on the monitored response, say impedance at a particular frequency or DC resistance.

In dependency upon the determined temperature, the loudspeaker signal is adapted. For example, if the temperature is above a pre-determined temperature, the loudspeaker signal may be attenuated. To maintain an evaluation signal of a known energy, e.g. a predetermined constant energy or amplitude, the input sound signal may also be attenuated before combining it with the evaluation signal. In reaction to the adapted loudspeaker signal the temperature of the voice coil reduces and thereby reducing temperature induced artifacts. On the other hand, if the determined temperature is below a further pre-determined temperature, the loudspeaker signal may be adapted to increase in volume or quality.

It is not necessary in the feedback loop comprising adapting the loudspeaker signal, playing the loudspeaker signal on the loudspeaker, and monitoring the response, to explicitly determine the impedance, DC resistance or temperature. Instead the adaptation may depend directly on the measured response, e.g., current and/or voltage. For example, a component of the current at a particular frequency may be determined and may be used directly to control the attenuation of the input sound signal, using a table.

In an embodiment, the evaluation signal comprises a signal has a particular evaluation frequency.

The temperature of the voice coil may be determined using a signal having any frequency. In particular, it is not necessary for the signal to comprise a frequency component of sufficient energy higher than the resonant frequency of the loudspeaker.

The evaluation signal may comprise two or more signals having two or more different frequencies. The evaluation signal may comprise a single signal of the particular evaluation frequency. For example, the evaluation signal may be a sine wave of the particular frequency, or a combination of two or more sine waves. The evaluation signal preferably has a pre-determined fixed amplitude and/or energy.

In an embodiment, the processing unit comprises a spectral analyzer to obtain a frequency component of the monitored response at the evaluation frequency. Adapting the loudspeaker signal to control the temperature of the voice coil is in dependency on the frequency component of the monitored response at the evaluation frequency.

The calibration and/or modeling of a loudspeaker system is simplified if its input-response behavior need only be considered for a particular frequency. Moreover, it is known in advance which frequency in the loudspeaker signal will be used for evaluating the condition of the voice coil, e.g. its temperature and for adapting of the loudspeaker signal. Without the evaluation signal one would depend on frequencies and energy levels that happen to be available in the input sound signal. This makes the determination of the temperature of the voice coil less predictable, robust and accurate. Having a known evaluation signal allows determining of precise tables giving the relationship between monitored response at the particular frequency and temperature, e.g., during a calibration phase of the loudspeaker during a design of the sound system.

Many spectral transforms may be used, e.g., wavelets transform etc. It is has been observed that the Fourier transform is particularly effective for use in the spectral analyzer.

Using a Fourier Transform, one could evaluate the signal components for a set of frequencies, typically linearly spaced between 0 Hz and the Nyquist frequency, after which one would restrict to a particular desired frequency, e.g., to the evaluation frequency.

In an embodiment, the spectral analyzer is configured for the Discrete Fast Fourier Transform at the evaluation frequency. Advantageously, when using the discrete Fast Fourier one may determine the signal component in the monitored response for the evaluation frequency only. In this particular case, using the Discrete Fourier Transform is computationally more efficient.

In an embodiment, the evaluation signal is combined with the input sound signal during a limited time period, say a period of 2 seconds. The electric response monitored during the limited time period is spectrally transformed. In a preferred embodiment, the spectral response according to the Fourier transform is derived only at the evaluation frequencies. The response may be averaged over the limited time period. The limited time period may be repeated or iterated, either immediately, or after a predetermined waiting interval, say of 5 seconds. Both averaging and a waiting interval avoid adapting the input sound signal too frequently, which may be noticeable to a listener of the system. Furthermore, averaging increases the accuracy of the temperature evaluation.

Preferably, the audible distortion introduced in the input sound signal is negligible for at least for practical purposes, compared to distortion introduced by other means, e.g., introduced due to a limited fidelity of the loudspeaker or introduced due to thermal distortion.

In an embodiment, the evaluation signal is configured for the loudspeaker to generate no or inaudible sound in response to the evaluation signal.

It is a further insight of the inventor, that it is not necessary for the evaluation signal to produce any audible sound in order to use it to determine the temperature of the voice coil. It is sufficient if the electric response of the voice coil to the evaluation signal depends on its temperature. In an embodiment, the evaluation frequency is below the resonant frequency of the loudspeaker. It is has been established that this is the case, not only for frequencies above the resonant frequency of the loudspeaker but also for evaluation signals having a frequency below the resonant frequency of the loudspeaker.

For example, a loudspeaker may be unable to efficiently produce sounds of a particular frequency, say of 100 Hertz or lower, although the voice coil of the loudspeaker does respond electrically to a signal component of that particular frequency in the loudspeaker signal. For such a loudspeaker the evaluation frequency may be chosen at the particular frequency, say at 100 Hertz.

In an embodiment, the loudspeaker is configured with a lower frequency bound below which the loudspeaker is configured for generating no or inaudible sound in response to signal components in the loudspeaker signal having a frequency below the lower frequency bound, and wherein the evaluation frequency is below the lower frequency bound.

Loudspeakers are not capable of producing all possible frequencies. In particular, very low frequencies will not be audibly produced on the loudspeaker.

By selecting an evaluation frequency below this bound, the evaluation signal will not cause an audible response; it will however produce an electric response. The electric response can be used for reliable and continuous temperature measurement while the user of the sound system cannot hear the presence of the evaluation signal.

A sound is inaudible if the sound pressure level is below a predetermined bound. The predetermined bound may be taken as the absolute hearing threshold at the particular frequency. If small concessions to the quality of sound production are acceptable, the bound may be taken somewhat higher. As a practical limit for audibility, 30 dB may be used.

Estimating voice coil temperature by adding an evaluation signal to the input sound signal is applicable to all types of loudspeakers prone to heating problems. However, the method is more attractive for loudspeakers with high resonance frequencies, above 400 Hz, since these have a low efficiency in generating low frequencies. As a result an evaluation signal that is used by the method will produce very low acoustical output.

The evaluation signal may also have a combination of low amplitude and low frequency which causes it not to produce an audible response in the loudspeaker.

In an embodiment, the processing unit comprises a psycho acoustic model for determining a masked frequency, the input sound masking the masked frequency, and wherein the evaluation frequency is configured to be the masked frequency.

Instead of using a frequency which is inaudible because the loudspeaker is not capable of producing it, one may also select a frequency which will not be audible to a human listener, since it is masked by the input sound signal.

In an embodiment, the processing unit comprises a frequency detector for determining the amplitude of a signal component in the input sound signal of the evaluation frequency, the processing unit being configured for only combining the evaluation signal with the input sound signal if the determined amplitude is below a predetermined threshold. For example, the processing unit may comprise means for detecting whether there is sufficient input signal energy at the evaluation frequency.

For example, means for detecting whether there is sufficient input signal energy at the evaluation frequency may be comprised in the spectral analyzer. By determining the magnitude of a signal component of the evaluation frequency, it may be determined if it has sufficient energy. Note that a spectral analyzer may be implemented in software, possibly in combination with an analog-to-digital converter, or in hardware circuits.

The evaluation signal may always be added to the input signal. However if the input signal already contains a signal of sufficient energy at the evaluation frequency, this is not necessary. In this way it is avoided that the evaluation signal adds to the power consumption of the amplifier. Moreover, audibility is a threshold-related concept. Hence, if the evaluation signal is inaudible partly because of its low volume, i.e., amplitude, adding it to an input sound signal which also comprises components at this frequency may cause it to become audible in combination with the input signal.

In an embodiment, the processing unit comprises a frequency filter for removing from the input signal a signal component of the evaluation frequency before combining the filtered input sound signal with the evaluation signal.

Filtering the input signal at the evaluation frequency ensures that the signal component at the frequency in the loudspeaker signal is precisely known. This gives an increased accuracy in temperature evaluation. Moreover, it can be precisely controlled that the evaluation signal is inaudible.

In an embodiment, the processing unit is configured for adapting the loudspeaker signal to decrease the temperature of the voice coil in dependency on the monitored response indicating that the temperature of the voice coil is above a predetermined temperature threshold.

Decreasing the temperature of the voice coil decreases temperature induced artifacts in the loudspeaker.

In an embodiment, adapting the loudspeaker signal to control the temperature of the voice coil comprises attenuating at least one signal component in the loudspeaker signal.

There are several ways in which the loudspeaker signal may be adapted to reduce the temperature of the voice coil. For example, the loudspeaker signal may be generally attenuated. However, this is not necessary, the signal may be attenuated only for certain frequencies.

In an embodiment, adapting the loudspeaker signal to control the temperature of the voice coil comprises filtering the input sound signal with a low-pass filter. High frequencies contribute the most to the temperature of the voice coil. By removing high frequencies from the signal the temperature will reduce.

A further aspect of the invention concerns a method for producing sound. The method comprises processing an input sound signal to produce a loudspeaker signal, the loudspeaker signal being configured for generating sound through a loudspeaker, the loudspeaker comprising a voice coil for driving the loudspeaker, a temperature of the voice coil depending on the loudspeaker signal, and adapting the loudspeaker signal to control the temperature of the voice coil in dependency on an electric response of the voice coil to the loudspeaker signal. The method further comprises generating an evaluation signal. Processing the input sound signal to produce a loudspeaker signal comprises combining the evaluation signal with the input sound signal.

A further aspect of the invention concerns a method for obtaining a temperature of a voice coil. The method comprises processing an input sound signal to produce a loudspeaker signal, the loudspeaker signal being configured for generating sound through a loudspeaker, the loudspeaker comprising a voice coil for driving the loudspeaker, a temperature of the voice coil depending on the loudspeaker signal. The method further comprises generating an evaluation signal. Processing the input sound signal to produce a loudspeaker signal comprises combining the evaluation signal with the input sound signal, and determining the temperature of the voice coil in dependency on the monitored response.

A method according to the invention may be implemented on a computer as a computer implemented method, or in dedicated hardware, or in a combination of both. Executable code for a method according to the invention may be stored on a computer program product. Examples of computer program products include memory devices, optical storage devices, integrated circuits, servers, online software, etc.

In a preferred embodiment, the computer program comprises computer program code means adapted to perform all the steps of a method according to the invention when the computer program is run on a computer. Preferably, the computer program is embodied on a computer readable medium.

A sound system for producing sound on a loudspeaker is provided wherein the temperature of a voice coil of the loudspeaker may be monitored continuously. The sound system comprises a signal generator for generating an evaluation signal which is added to an input sound signal to obtain a loudspeaker signal and a monitor for monitoring an electric response of the voice coil to the loudspeaker signal. The loudspeaker signal may be adapted to control the temperature of the voice coil in dependency upon the monitored response. The system can determine the temperature of the voice coil even if the input sound signal comprises only little sound energy.

BRIEF DESCRIPTION OF THE DRAWINGS

The invention is explained in further detail by way of example and with reference to the accompanying drawings, wherein.

Throughout the Figures, similar or corresponding features are indicated by same reference numerals.

LIST OF REFERENCE NUMERALS 100 a sound system
110 a processing unit
120 an input sound signal
130 a loudspeaker
140 a monitor
150 a signal generator
160 a combiner
170 a controller
180 a signal adaption unit
190 an amplifier
200 a sound system
270 a temperature evaluator
300 a method for producing sound
310 generating a evaluation signal
320 combining the evaluation signal with an input sound signal to produce a loudspeaker signal
330 generating sound through a loudspeaker depending on the loudspeaker signal
340 obtaining an electric response of the loudspeaker's voice coil to the loudspeaker signal
350 determining the temperature of the voice coil in dependency on the monitored response
360 adapting the loudspeaker signal to control the temperature of the voice coil in dependency on the electric response of the voice coil to the loudspeaker signal

DETAILED DESCRIPTION

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

Figure 1:
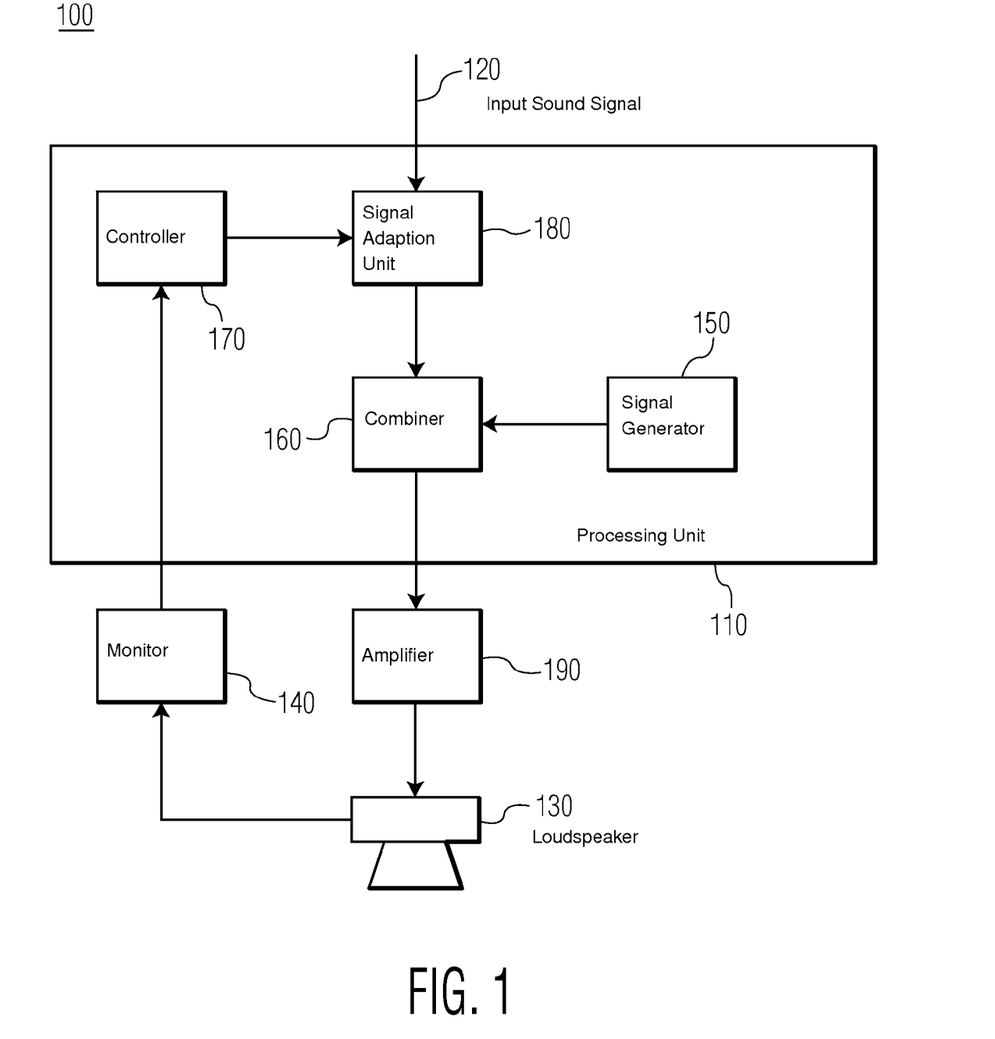
FIG. 1 is a block diagram illustrating an embodiment of a system 100 for producing a sound.

FIG. 1 shows in schematic form a sound system 100 for producing a sound. Some of the data dependencies have been indicated by arrows.

The system obtains an input sound signal 120 from a source. The signal may be received at an input to the system 100. For example, the input sound signal 120 may be obtained from a source external to the system. Input signal 120 may also be retrieved from a storage system. The input signal may be analog or digital. In an embodiment, the system comprises a storage device, e.g. a hard disk or a memory such as a flash memory, for storing a digital representation of the input signal, and corresponding retrieval means.

Sound system 100 further comprises a loudspeaker 130. Loudspeaker 130 is configured for receiving a loudspeaker signal and for generating sound in dependency on the loudspeaker signal. Loudspeaker 130 comprises a voice coil for driving the loudspeaker (not shown). The temperature of the voice coil is dependent upon the loudspeaker signal that loudspeaker 130 receives plays.

Sound system 100 comprises a monitor 140 connected or comprised in loudspeaker 130 for monitoring an electric response of the voice coil to the loudspeaker signal. In particular monitor 140 may be configured to measure the current passing through the voice coil and/or to measure the voltage across the voice coil. Instead of monitoring the current, monitor 140 may be configured to monitor the signal energy at the evaluation frequency, that is, the square of the frequency component of the current at the evaluation frequency.

Sound system 100 comprises a processing unit 110 for producing and/or adapting the loudspeaker signal to control the temperature of the voice coil in dependency on the electric response of the voice coil to the loudspeaker signal obtained by monitor 140.

Processing unit 110 is configured to receive or retrieve input sound signal 120. Processing unit 110 is connected to loudspeaker 130 for playing the loudspeaker signal and to produce sound. Typically processing unit 110 is connected to loudspeaker 130 via an amplifier 190. Processing unit 110 is connected to monitor 140 for receiving the monitored electronic response.

Processing unit 110 comprises a signal adaption unit 180 for adapting input sound signal 120 to control the temperature of the voice coil. If the temperature of the voice coil is too high or appears to become too high, signal adaption unit 180 may adapt the signal to reduce the temperature, e.g., signal adaption unit 180 may reduce the power level of the input sound signal. For example, signal adaption unit 180 may be configured for attenuation of the input signal, for a filtering operation of the input signal, etc. Signal adaption unit 180 may be configured to apply audio compression, also known as dynamic range compression, to the input sound signal 120.

Processing unit 110 comprises a signal generator 150 for generating an evaluation signal. Signal generator 150 may be a sine wave generator for generating a sine wave at an evaluation frequency. Processing unit 110 comprises a combining unit 160 for combining the evaluation signal with the input sound signal 120. For example, the evaluation signal may be added to the input sound signal. In this embodiment, combining unit 160, combines the adapted input sound signal which it receives from signal adaption unit 180 with the evaluation signal. Combiner 160 forwards the combined signals to loudspeaker 130, via amplifier 190, as the loudspeaker signal. Possibly, the evaluation signal may be combined with the input sound signal after amplification.

The evaluation sine wave is combined with the adapted input sound signal, either always or only when there is insufficient input signal energy at the evaluation frequency. For an analog hardware implementation, the sine wave generator and the signal energy detector (at the evaluation frequency) are implemented as electronic circuits.

Processing unit 110 comprises a controller 170 for receiving from monitor 140 the monitored electronic response. Controller 170 determines from the response to the current temperature of the voice coil.

A control signal for controlling signal adaption unit 180 may be derived from the voltage and/or the current signals and is used for controlling the adaptation of the input sound signal in such a way that the voice coil temperature does not exceed a certain temperature threshold.

A control signal is sent from controller 170 to signal adaption unit 180 instructing the latter to adapt the signal for a temperature reduction or not. For example, the voltage across, v, and the current flowing into the loudspeaker voice coil, i, are monitored and are sent to controller 170 component, which estimates the voice coil temperature or some representation thereof. A control signal that is sent from controller 170 may be a binary signal, instructing signal adaption unit 180 to start a temperature reduction program. A control signal that is sent from controller 170 may comprise a value indicating the magnitude of the desired reduction.

The functionality of controller 170 and signal adaption unit 180 may be shared, for example, controller 170 may determine the impedance at an evaluation frequency and forward the impedance to signal adaption unit 180. Signal adaption unit 180 may adapt the input sound signal such that the temperature in the voice coil is reduced in dependency on this value, e.g., in reverse proportion to the impedance.

A digital implementation may use additional analog-to-digital (ADC) and digital-to-analog (DAC) converters for converting the voltage and current signals to the digital domain. Processing unit 110 may be implemented in software using a DSP or micro-controller. An analog-to-digital (ADC) converter is placed between monitor 140 and controller 170. The digital-to-analog converter (DAC) is placed between combiner 160 and amplifier 190.

The input sound signal is applied to the DSP or micro-controller, or it may be stored in the memory of the DSP or micro-controller. The evaluation signal is combined with the input sound signal by the DSP or micro-controller, either always or only when there is insufficient input signal energy at the evaluation frequency. The combined signal is converted to the analog domain by the digital-to-analog converter (DAC), after which it may be amplified and played on the loudspeaker.

The evaluation signal may be generated on the DSP or micro-controller, and the combining, monitoring such as signal energy detection, and estimation steps can also be performed on the DSP or microcontroller. The estimated voice coil temperature may be stored in a memory of the DSP or micro-controller.

The evaluation signal is combined with the adapted input sound signal, and converted to the analog domain and sent to the amplifier and loudspeaker. The voltage across and/or the current flowing into the voice coil are monitored and converted to the digital domain (ADC). They are used for computing the control signal(s). The control signal is optionally smoothed, e.g., by using a moving average.

For an analog hardware implementation, signal generator 150, e.g. a sine wave generator, and monitor 140, controller 170, signal adaption unit 180 and combiner 160 may be implemented as electronic circuits.

Figure 2:
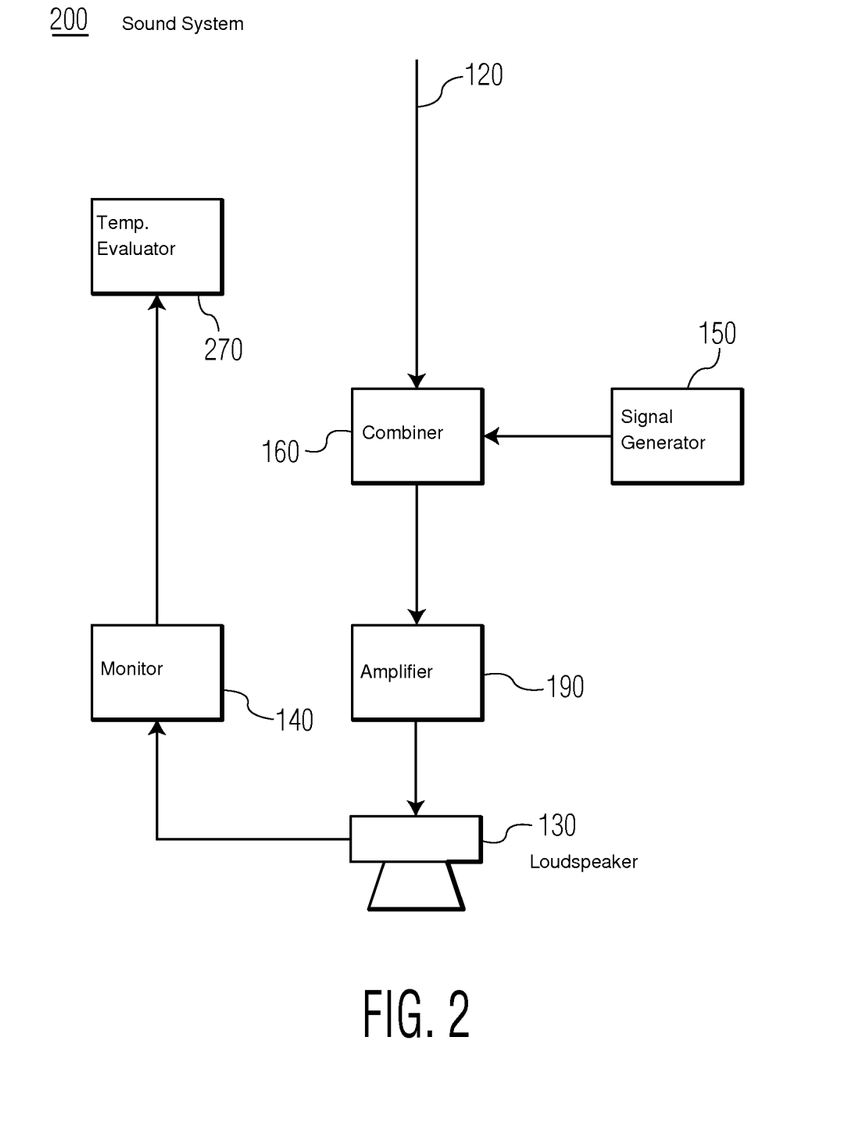
FIG. 2 is a block diagram illustrating an embodiment of a system 200 for obtaining a temperature of a voice coil.

FIG. 2 shows in schematic form a system 200 for obtaining a temperature of a voice coil. Sound system 200 shares most of the components of sound system 100, in particular, sound system 200 comprises a signal generator 150, combiner 160, amplifier 190, loudspeaker 130 and monitor 140. Sound system 200 does not necessarily comprise a signal adaption unit 180 and controller 170. Sound system 200 comprises a temperature evaluator 270 for determining the temperature of the voice coil in dependence on the monitored electronic response.

Figure 3:
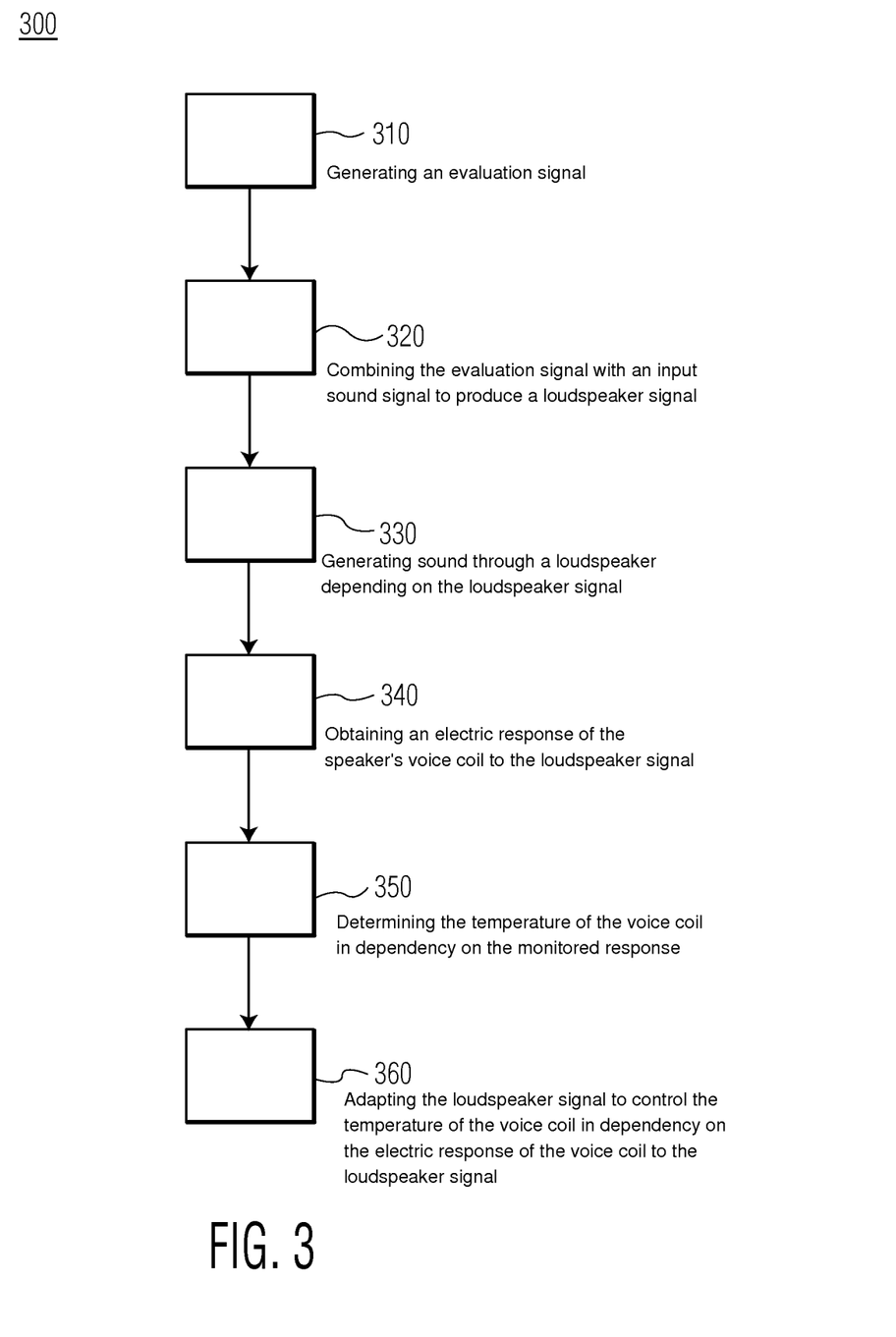
FIG. 3 is a flow chart illustrating a method of adapting the loudspeaker signal to control the temperature of the voice coil.

FIG. 3 shows in schematic form a method 300 for producing sound. Arrows indicate possible data dependencies.

Step 310 comprises generating an evaluation signal.

Step 320 comprises combining the evaluation signal with an input sound signal to produce a loudspeaker signal.

Step 330 comprises generating sound through a loudspeaker in dependency on the loudspeaker signal.

Step 340 comprises obtaining an electric response of the voice coil to the loudspeaker signal.

Step 350 comprises determining the temperature of the voice coil in dependency on the monitored response.

Step 360 comprises adapting the loudspeaker signal to control the temperature of the voice coil in dependency on the electric response of the voice coil to the loudspeaker signal.

Many different ways of executing the method are possible, as will be apparent to a person skilled in the art. For example, the order of the steps can be varied or some steps may be executed in parallel. Moreover, in between steps other method steps may be inserted. The inserted steps may represent refinements of the method such as described herein, or may be unrelated to the method. For example, most of the steps can be executed, at least partially, in parallel. For example, monitoring 340 and generating 330 will be in parallel. A given step may not have completely finished before a next step is started or continuous.

For a method of producing sound, step 350 may be omitted, instead the input sound single may be modified directly without explicitly computing the temperature. For a method to obtain the temperature of the voice coil, step 360 may be omitted.

A method according to the invention may be executed using software, which comprises instructions for causing a processor system to perform method 300. Software may only include those steps taken by a particular sub-entity of the system. The software may be stored in a suitable storage medium, such as a hard disk, a floppy, a memory etc. The software may be sent as a signal along a wire, or wireless, or using a data network, e.g., the Internet. The software may be made available for download and/or for remote usage on a server.

It will be appreciated that the invention also extends to computer programs, particularly computer programs on or in a carrier, adapted for putting the invention into practice. The program may be in the form of source code, object code, a code intermediate source and object code such as partially compiled form, or in any other form suitable for use in the implementation of the method according to the invention. It will also be appreciated that such a program may have many different architectural designs. For example, a program code implementing the functionality of the method or system according to the invention may be subdivided into one or more subroutines. Many different ways to distribute the functionality among these subroutines will be apparent to the skilled person. The subroutines may be stored together in one executable file to form a self-contained program. Such an executable file may comprise computer executable instructions, for example, processor instructions and/or interpreter instructions (e.g. Java interpreter instructions). Alternatively, one or more or all of the subroutines may be stored in at least one external library file and linked with a main program either statically or dynamically, e.g. at runtime. The main program contains at least one call to at least one of the subroutines. Also, the subroutines may comprise function calls to each other. An embodiment relating to a computer program product comprises computer executable instructions corresponding to each of the processing steps of at least one of the methods set forth. These instructions may be subdivided into subroutines and/or be stored in one or more files that may be linked statically or dynamically. Another embodiment relating to a computer program product comprises computer executable instructions corresponding to each of the means of at least one of the systems and/or products set forth. These instructions may be subdivided into subroutines and/or be stored in one or more files that may be linked statically or dynamically.

The carrier of a computer program may be any entity or device capable of carrying the program. For example, the carrier may include a storage medium, such as a ROM, for example a CD ROM or a semiconductor ROM, or a magnetic recording medium, for example a floppy disc or hard disk. Furthermore, the carrier may be a transmissible carrier such as an electrical or optical signal, which may be conveyed via electrical or optical cable or by radio or other means. When the program is embodied in such a signal, the carrier may be constituted by such cable or other device or means. Alternatively, the carrier may be an integrated circuit in which the program is embedded, the integrated circuit being adapted for performing, or for use in the performance of, the relevant method.

Detailed description of how the temperature of the voice coil may be estimated from monitored electric response of the voice coil is given below. The estimation is done by controller 170 and/or signal adaption unit 180 and temperature evaluator 270, but may be implicit. Various other aspects of the invention are also further elaborated upon.

Impedance of a Loudspeaker

The loudspeaker impedance, $Z(\omega)$, is a complex-valued function of frequency $\omega$, and can be computed as the ratio between the voltage across the voice coil, $v(\omega)$, and the current flowing into the voice coil, $i(\omega)$, both as a function of frequency: $Z(\omega)=v(\omega)/i(\omega)$.

One may use several representations of the impedance or values which are derived therefrom. As the impedance as defined above takes complex values it is often convenient to convert these to real values, although this is not strictly necessary. For example instead of a complex value one may take its real part, the average of the real part over a region, or its magnitude, etc. In the text below we will assume the magnitude of impedance is used, but other choices are possible.

If desired the voltage across the voice coil may be approximated by a processed value of the adapted input sound signal (e.g., a linearly scaled version thereof). Thus replacing $v(\omega)$ may reduce the accuracy of the temperature estimation somewhat, although the accuracy may be sufficient for some applications. The possible inaccuracy cause by not monitoring the voltage is mainly due to the DAC and amplifier. For example, the amplifier is expected to scale the input linearly with a certain factor but due to tolerances, this factor is not exactly known.

Estimating the voice coil temperature may be based on the monitored electric response of the voice coil and certain quantities that are derived therefrom, for example, DC resistance and impedance at a particular frequency.

Figure 4A:
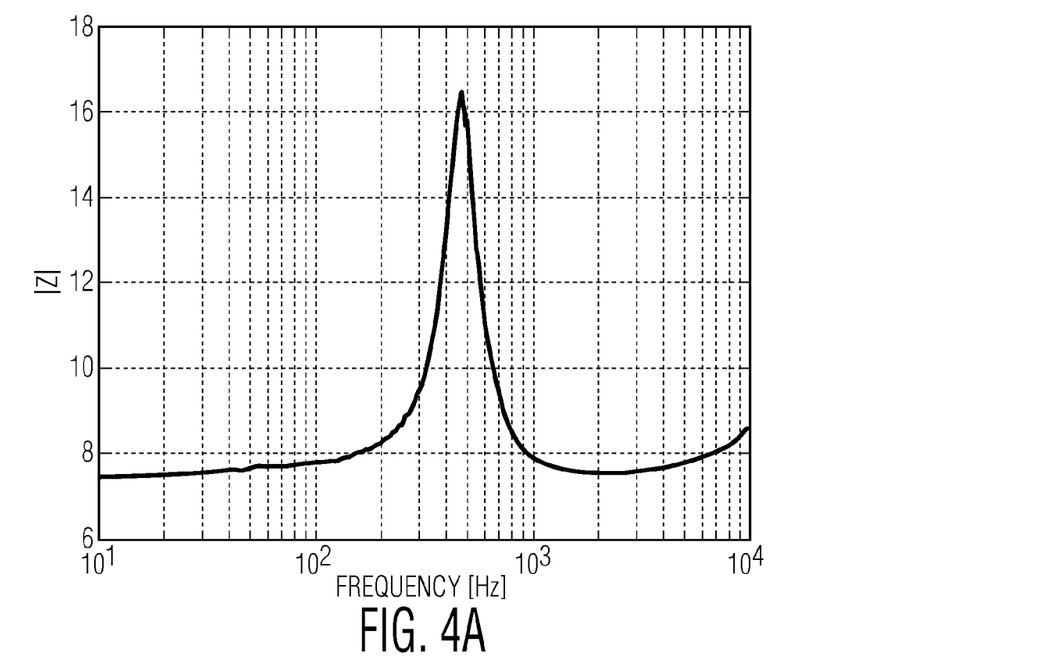
FIG. 4a is a graph showing impedance as a function of frequency for a typical loudspeaker.

FIG. 4a shows the magnitude plot of a typical loudspeaker impedance function, which shows a 'resonance' peak at approximately 450 Hz.

The DC resistance of the loudspeaker, Re, is an important property. The DC resistance, Re, depends on the temperature of the voice coil. The DC resistance may be estimated as the average of the real part of the impedance for frequencies in the vicinity of the minimum impedance exceeding the resonant frequency (approximately 2200 Hz in FIG. 4a). In the example shown in FIG. 4A, the DC resistance is approximately 7.5Ω.

The impedance of the loudspeaker at particular frequency where the impedance as a function of the temperature of the voice coil is increasing may also be used to estimate voice coil temperature, in particular frequencies below the resonance frequency. For example, impedance for a frequency below 400 Hertz, or above 800 Hertz may be used. For example, impedance at a frequency of 50, 100, 200 Hertz may be used to estimate the temperature of the voice coil.

Voice Coil Temperature

As the input power is dissipated into heat, the rise in temperature of the voice coil also increases its impedance at most frequencies and the DC resistance of the voice coil, Re.

Estimating the voice coil temperature may be based on the loudspeaker impedance at a single evaluation frequency, $\omega_z$.

Figure 4B:
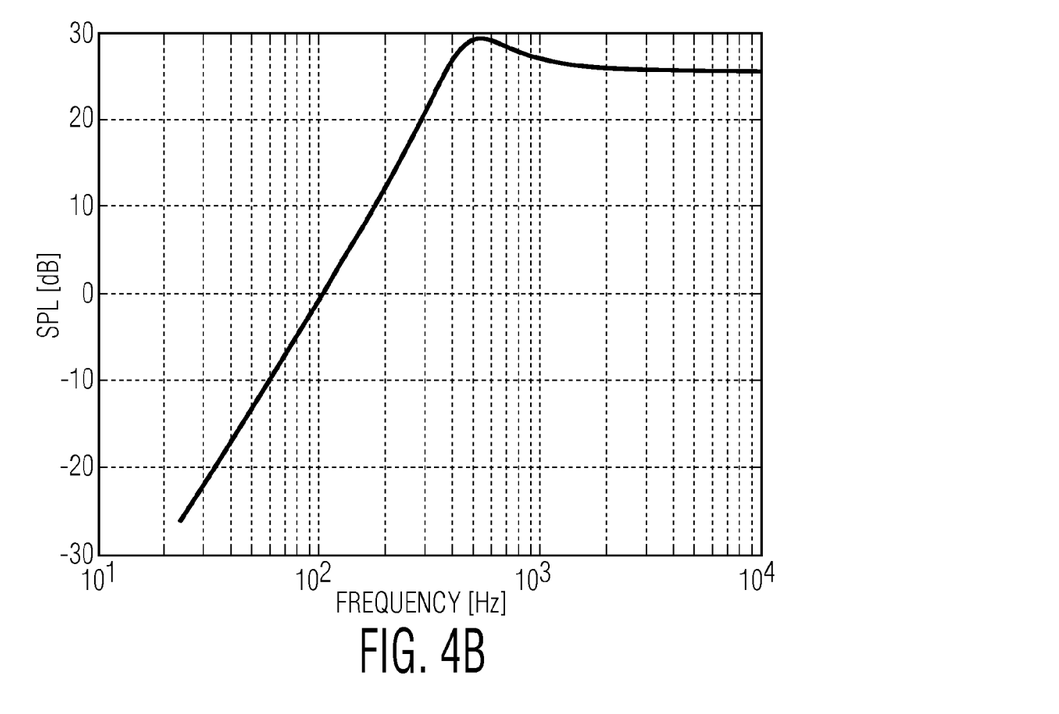
FIG. 4b is a graph showing sound pressure level (SPL) as a function of frequency of fixed amplitude.

The evaluation frequency may be chosen below the expected resonance frequency of the loudspeaker, at a frequency that produces very little acoustical output. FIG. 4b shows the sound pressure level (SPL) output for a typical loudspeaker. Frequencies lower than, say, 100 Hz, are reproduced considerably less, and are therefore good candidates as evaluation frequencies. The magnitude of the impedance at this frequency is an approximation of the DC resistance of the loudspeaker.

Figure 5A:
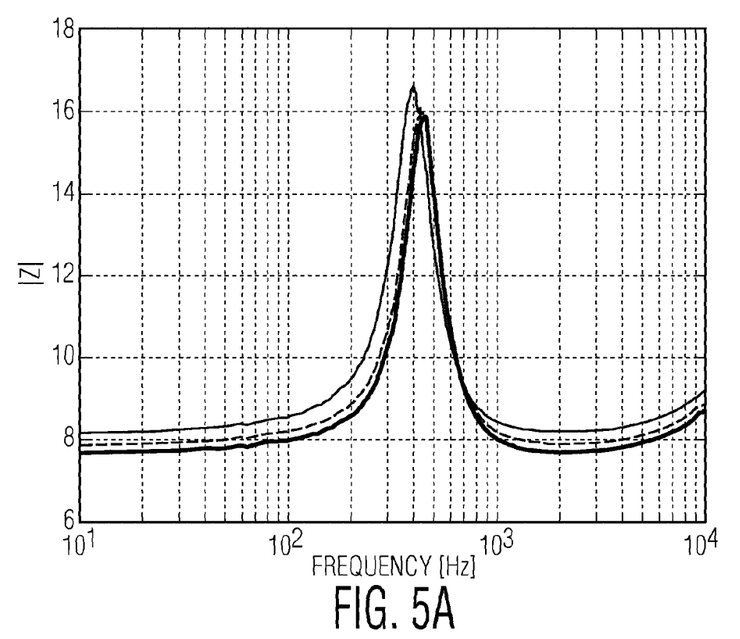
FIG. 5a is a graph showing impedance as a function of frequency for different temperatures of the voice coil.

FIG. 5a shows typical loudspeaker impedance functions for different temperatures. The temperature increases from thick solid, to thick dashed, to thin solid curves. The figure shows that impedance increases with the temperature. It can be observed that the magnitude of the impedance function increases in approximately the same manner as the DC resistance, except at frequencies close to the resonant frequency. However, an important difference is that the DC resistance is determined at frequencies above the resonance frequency, while an impedance may be determined at any frequency, including frequencies below the resonance frequency.

To ensure that there is sufficient input signal energy at the evaluation frequency, an evaluation signal at the evaluation frequency, generated by signal generator 150, is added to the input signal, by combiner 160. The evaluation signal may be an evaluation sine wave. It is preferred that the amplitude is chosen sufficiently low so as to produce no audible acoustical output. It is also possible to use a detection mechanism to add the evaluation sine wave only when the signal energy of the loudspeaker input at the evaluation frequency, or a processed version thereof, drops below a certain signal energy threshold. It is also possible to filter the input signal such that it contains very little signal energy at the evaluation frequency and always add the evaluation sine wave. Another possibility is to use an evaluation sine wave at a frequency that would produce an audible acoustical output, but to choose the frequency such that it is masked by the other frequencies that are present in the input signal. A frequency which is masked by the input signal can be determined using a psychoacoustic model.

The voltage and the current are preferably measured and converted to the digital domain, e.g. using analog-to-digital converters.

The magnitude of impedance at the evaluation frequency, can be computed by taking the magnitude of $Z(\omega)=v(\omega)/i(\omega)$. The quantities $v(\omega)$, and $i(\omega)$ are obtained my transforming the measured voltage and current into the frequency domain. In the case of a digital implementation Using the Discrete Fourier Transform (DFT), $v(\omega)$, and $i(\omega)$, can be efficiently computed at the evaluation frequency.

If the input signal was filtered to remove the evaluation frequency, then it may be assumed that $v(\omega)$ consists only of the evaluation sine wave, in which case its magnitude may be considered as a constant value. In that case, the magnitude of the impedance at the evaluation frequency is a function of only the magnitude of the current at the evaluation frequency. Instead of using the magnitude of the current at the evaluation frequency one may one may use its square $|i(\omega)|^2$ instead, which may be more convenient in some implementations.

The voice coil temperature, T, can be estimated by solving the following equation with respect to T:

$$\frac{|Z(\omega_z)|}{|Z_0(\omega_z)|} = 1 + \alpha(T - T_0) + \beta(T - T_0)^2$$

where α and β are temperature coefficients that depend on the properties of the voice coil material, and $Z_0(\omega_z)$ is the impedance at the evaluation frequency at the reference temperature $T_0$. Note that this formula is a Taylor series approximation. For a simpler implementation, at the cost of less accuracy, the exponent 2 term may be ignored. For a more accurate implementation exponent 3 or higher terms may be considered. The temperature coefficients may be obtained by evaluating the formula for voice coils of various temperatures and obtaining the impedance. If a sufficiently accurate model of the loudspeaker is available, the experiment may be done virtually. Alternatively, an embodiment may use a table listing the voice coil temperature for various values of the impedance at the evaluation frequency. One may use interpolation, e.g., linear interpolation, to obtain temperature estimates for impedance values which are not in the list.

Similarly, if one derives the DC resistance from the monitored current and/or voltage. The temperature may be obtained by solving:

$$\frac{R_e}{R_{e0}} = 1 + \alpha(T - T_0) + \beta(T - T_0)^2$$

Wherein $R_e$ represents the DC resistance and $R_{e0}$ a reference DC resistance at the reference temperature. Typically, the temperature coefficients that depend on the properties of the voice coil material will be different.

Figure 5B:
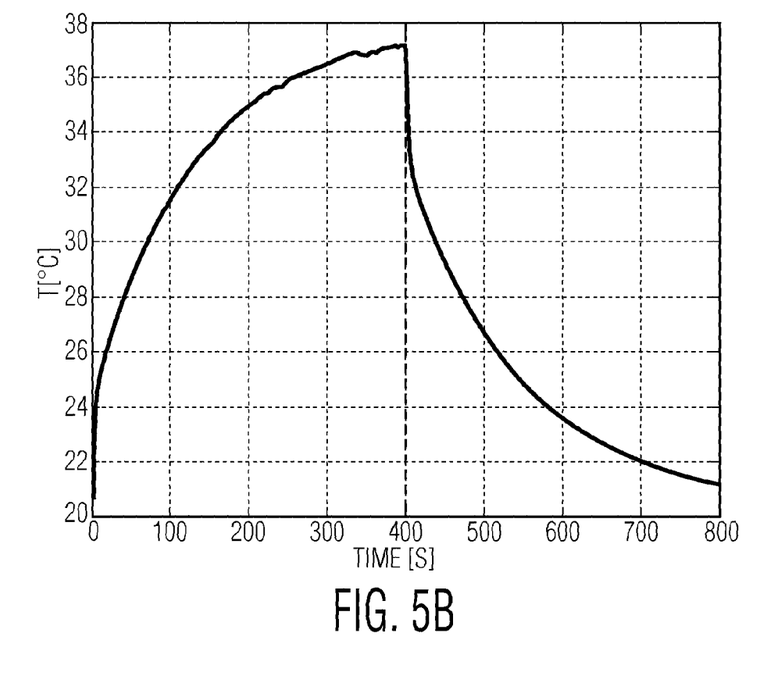
FIG. 5b is a graph showing temperature of a voice coil for a particular input signal.

FIG. 5b shows an example result of the proposed invention. A white noise signal has been sent to a loudspeaker for a duration of 400 seconds (left side of the dashed, vertical line in FIG. 5b), followed by a silent period of 400 seconds (right side of the dashed, vertical line in FIG. 5b). During the total segment of 800 seconds, the voice coil temperature is estimated using a method according to the invention, in short non-overlapping segments of two seconds, and plotted in FIG. 5b.

The figure shows that the voice coil temperature increases during the first segment of 400 seconds, after which it cools down. Comparison of the voice coil temperature obtained by established means and using a method according to the invention show that the voice coil temperature was obtained with sufficient accuracy.

To protect a loudspeaker against thermal damage, the estimated temperature (or some value which depends thereon, or is derived therefrom) can be used in a feedback control system.

The input sound signal is processed by signal adaption unit 180 in dependency on a control signal(s) obtained from controller 170, and optionally by user-defined parameters.

A thermal protection scheme for the loudspeaker as may be implemented by signal adaption unit 180 can use one or more of the following (feedback) control signals, e.g. computed in controller 170 or signal adaption unit 180
- the estimated voice coil temperature, or a smoothed version thereof,
- the magnitude of the impedance at the evaluation frequency, or a smoothed version thereof,
- the signal energy of the current at the evaluation frequency, $|i(\omega_z)|^2$, or a smoothed version thereof. Especially, if the voltage component at the evaluation frequency, $v(\omega_z)$ can be assumed constant.

The feedback control system ensures that the voice coil temperature does not exceed a certain threshold value. One may achieve this by ensuring that the control signal(s) should or should not exceed a certain threshold. This can be obtained by controlling signal adaption unit 180 that adapts the input sound signal in a manner controlled by the control signal(s).

The processing can be, but is not limited to:
- an attenuation of the input sound signal,
- a filtering operation of the input sound signal,
- an audio compression algorithm applied to the input sound signal.

It is possible to implement this processing module on the DSP or micro-controller that is used for estimating the voice coil temperature, or it can be implemented in analog hardware.

The invention is especially advantageous when applied to loudspeakers that are used close to their thermal limits. It is, in particular, attractive for mobile devices, in combination with methods for maximizing the sound-pressure-level (SPL) output of the loudspeaker. Indeed, driving a loudspeaker to its limits to maximize the SPL can cause severe heating of the loudspeaker, making a thermal protection scheme advantageous.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An audio controller for processing an input sound signal to generate a loudspeaker signal, the audio controller comprising:
   a monitor to monitor an electric response of a voice coil of a loudspeaker to the loudspeaker signal;
   a signal generator to generate an evaluation signal, the evaluation signal comprises a signal having an evaluation frequency that is below resonant frequency of the loudspeaker;
   a processing unit to generate, based on the monitored electric response, the loudspeaker signal from the input sound signal, wherein the processing unit is configured to combine the evaluation signal with the input sound signal to generate the loudspeaker signal, wherein the processing unit is configured to modify the loudspeaker signal to control the temperature of a voice coil of the loudspeaker by attenuating the loudspeaker signal in a first frequency band and without attenuating the loudspeaker signal in a second frequency band that has a lower frequency than the first frequency band.

2. The audio controller of claim 1, wherein the monitor is configured to monitor an electric current in the voice coil and, optionally, an electric voltage across the voice coil.

3. The audio controller of claim 1, wherein the monitor is configured to monitor an electric voltage across the voice coil.

4. The audio controller of claim 1, wherein the evaluation signal comprises a signal having a preselected evaluation frequency.

5. The audio controller of claim 1, wherein the processing unit includes a spectral analyzer to obtain a frequency component of the monitored response at the evaluation frequency and adapting the loudspeaker signal to control the temperature of the voice coil being in dependency on the frequency component of the monitored response at a preselected evaluation frequency.

6. The audio controller of claim 5, wherein the spectral analyzer is configured for a Discrete Fourier Transform at the preselected evaluation frequency.

7. The audio controller of claim 1, wherein a frequency of the evaluation signal is selected such that the evaluation signal produces no sound when processed through the loudspeaker.

8. The audio controller of claim 1, wherein a frequency of the evaluation signal is selected such that the evaluation signal produces inaudible sound when processed through the loudspeaker.

9. A sound system, comprising:
   a loudspeaker
   an audio controller for use with a loudspeaker that generates sound in dependence upon the loudspeaker signal, the loudspeaker including a voice coil, the audio controller comprising:
   a monitor to monitor an electric response of the voice coil to the loudspeaker signal;
   a signal generator to generate an evaluation signal, the evaluation signal comprises a signal having an evaluation frequency that is below resonant frequency of the loudspeaker;
   a processing unit to generate, based on the monitored electric response, the loudspeaker signal from an input sound signal, wherein the processing unit is configured to combine the evaluation signal with the input sound signal to generate the loudspeaker signal, wherein the processing unit is configured to modify the loudspeaker signal to control the temperature of the voice coil by attenuating the loudspeaker signal in a first frequency band and without attenuating the loudspeaker signal in a second frequency band that has a lower frequency than the first frequency band.

10. The sound system of claim 9, wherein impedance of the loudspeaker or temperature of the voice coil is determined from the monitored response, adapting the loudspeaker signal to control the temperature of the voice coil being in dependency on at least one of the determined impedance of the loudspeaker and the temperature of the voice coil respectively.

11. The sound system of claim 9, wherein the monitor is configured to monitor an electric current in the voice coil and, optionally, an electric voltage across the voice coil.

12. The sound system of claim 9, wherein the monitor is configured to monitor an electric voltage across the voice coil.

13. The sound system of claim 9, wherein the evaluation signal comprises a signal having a preselected evaluation frequency.

14. The sound system of claim 9, wherein the processing unit includes a spectral analyzer to obtain a frequency component of the monitored response at the evaluation frequency and adapting the loudspeaker signal to control the temperature of the voice coil being in dependency on the frequency component of the monitored response at a preselected evaluation frequency.

15. The sound system of claim 14, wherein the spectral analyzer is configured for a Discrete Fourier Transform at the preselected evaluation frequency.

16. The sound system of claim 9, wherein a frequency of the evaluation signal is selected such that the evaluation signal produces no sound when processed through the loudspeaker.

17. The sound system of claim 9, wherein a frequency of the evaluation signal is selected such that the evaluation signal produces inaudible sound when processed through the loudspeaker.

18. A non-transitory computer readable medium comprising programming instructions which when executed by a processor performs and operation to produce sound through a loudspeaker, the operation including:
- processing an input sound signal to produce the loudspeaker signal, the loudspeaker signal being configured for generating sound through a loudspeaker, the loudspeaker comprising a voice coil for driving the loudspeaker,
- using the loudspeaker signal to control the temperature of the voice coil in dependency on an electric response of the voice coil to the loudspeaker signal by attenuating the loudspeaker signal in a first frequency band without attenuating the loudspeaker signal in a second frequency band that has a lower frequency than the first frequency band,
- generating an evaluation signal, and
- processing the input sound signal to produce a loudspeaker signal by combining the evaluation signal with the input sound signal, wherein the evaluation signal comprises a signal having an evaluation frequency that is below the resonant frequency of the loudspeaker.

* * * * *